United States Patent
Onihashi (10) Patent No.: US 11,733,400 B2
(45) Date of Patent: Aug. 22, 2023

(54) RADIATION DETECTOR

(71) Applicant: CANON ELECTRON TUBES & DEVICES CO., LTD., Otawara (JP)

(72) Inventor: Hiroshi Onihashi, Nasushiobara (JP)

(73) Assignee: CANON ELECTRON TUBES & DEVICES CO., LTD., Otawara (JP)

( * ) Notice: Subject to any disclaimer, the term of this patent is extended or adjusted under 35 U.S.C. 154(b) by 55 days.

(21) Appl. No.: 17/475,955

(22) Filed: Sep. 15, 2021

(65) Prior Publication Data
US 2022/0043168 A1 Feb. 10, 2022

Related U.S. Application Data

(63) Continuation of application No. PCT/JP2020/007061, filed on Feb. 21, 2020.

(30) Foreign Application Priority Data

Apr. 4, 2019 (JP) .................. 2019-071958

(51) Int. Cl.
*G01T 1/17* (2006.01)
*G01T 1/20* (2006.01)
(Continued)

(52) U.S. Cl.
CPC .................. *G01T 1/17* (2013.01); *G01T 1/20* (2013.01); *G01T 1/24* (2013.01); *H04N 5/32* (2013.01); *H01L 27/14663* (2013.01)

(58) Field of Classification Search
CPC .... G01T 1/17; G01T 1/20; G01T 1/24; G01T 1/20184; G01T 1/247; G01T 7/005;
(Continued)

(56) References Cited

U.S. PATENT DOCUMENTS 9,554,759 B2 1/2017 Hawver et al.
2013/0015327 A1* 1/2013 Amitani ............ H01L 27/14618
250/208.1
(Continued)

FOREIGN PATENT DOCUMENTS

JP 2014-526178 A 10/2014
JP 2018-15455 A 2/2018
(Continued)

OTHER PUBLICATIONS

International Search Report dated Apr. 14, 2020 in PCT/JP2020/007061, filed on Feb. 21, 2020, 2 pages.

*Primary Examiner* — Kiho Kim
(74) *Attorney, Agent, or Firm* — Oblon, McClelland, Maier & Neustadt, L.L.P.

(57) ABSTRACT

According to an embodiment, a radiation detector includes: a substrate; multiple control lines; multiple data lines; multiple detecting parts detecting radiation including thin film transistors; a control circuit switching between ON and OFF-states of the transistor; a signal detection circuit reading image data when the transistor is in the ON-state; and an incident radiation detecting part determining an incidence start time of the radiation based on a value of the image data read when the transistor is in the ON-state. When the incident radiation detecting part determines that radiation incidence has started, the signal detection circuit performs a first reading process of further reading image data when the transistor is in the ON-state. The control circuit performs an image storage process of setting all of the transistors to the OFF-state after the first reading process.

8 Claims, 7 Drawing Sheets

(51) Int. Cl.
  *G01T 1/24* (2006.01)
  *H04N 5/32* (2023.01)
  *H01L 27/146* (2006.01)

(58) Field of Classification Search
  CPC .......... H04N 5/32; H04N 25/40; H04N 25/75;
       H04N 25/76; H01L 27/14663; H01L
              27/144; H01L 27/146
  See application file for complete search history.

(56) References Cited

U.S. PATENT DOCUMENTS

| | | |
|---|---|---|
| 2015/0034833 A1 | 2/2015 | Blanchon et al. |
| 2015/0078530 A1 | 3/2015 | Hawver et al. |
| 2015/0301200 A1* | 10/2015 | Watanabe ............... G01T 1/243 |
| | | 250/394 |
| 2015/0334323 A1* | 11/2015 | Egawa .............. H01L 27/14603 |
| | | 348/300 |
| 2018/0031715 A1 | 2/2018 | Kuwabara |
| 2019/0018152 A1 | 1/2019 | Onihashi |
| 2021/0144330 A1* | 5/2021 | Otaka .................... H04N 25/79 |

FOREIGN PATENT DOCUMENTS

| | | |
|---|---|---|
| JP | 6302122 B1 | 3/2018 |
| JP | 2018-107598 A | 7/2018 |
| JP | 2019-20141 A | 2/2019 |

* cited by examiner

RADIATION DETECTOR

CROSS-REFERENCE TO RELATED APPLICATIONS

This application is based upon and claims the benefit of priority from the Japanese Patent Application No. 2019-071958, filed on Apr. 4, 2019, and the PCT Patent Application PCT/JP2020/007061, filed on Feb. 21, 2020; the entire contents of which are incorporated herein by reference.

FIELD

Embodiments of the invention relate to a radiation detector.

BACKGROUND

An X-ray detector is an example of a radiation detector. For example, an array substrate that includes multiple photoelectric converters, and a scintillator that is provided on the multiple photoelectric converters and converts X-rays into fluorescence are provided in the X-ray detector. Also, for example, a photoelectric conversion element that converts the fluorescence from the scintillator into a charge, a thin film transistor that switches between storing and discharging the charge, a storage capacitor that stores the charge, etc., are provided in the photoelectric converter.

Generally, an X-ray detector reads image data as follows. First, the incidence of the X-rays is recognized by a signal input from the outside. Then, after a predetermined amount of time has elapsed, the thin film transistors of the photoelectric converters performing reading are set to the ON-state, and the stored charge is read as image data. However, to do so, a synchronous interface for synchronizing the X-ray detector with an external device such as an X-ray source, etc., is necessary.

Also, technology has been proposed in which the thin film transistors are set to the OFF-state, and the incidence start time of the X-rays is detected based on the difference between the value of the current flowing in the data lines when the X-rays are incident and the value of the current flowing in the data lines when the X-rays are not incident. However, the value of the current that flows in the data lines is extremely small when the thin film transistors are in the OFF-state. Therefore, even when the value of the current that flows in the data lines is detected when the thin film transistors are in the OFF-state, there is a risk that it may be difficult to detect the incidence start time of the X-rays with high accuracy.

Therefore, technology has been proposed in which the thin film transistors are set to the ON-state, and the incidence start time of the X-rays is detected based on the difference between the value of the current that flows in the data lines when the X-rays are incident and the value of the current that flows in the data lines when the X-rays are not incident. The incidence start time of the X-rays can be detected with high accuracy because the value of the current that flows in the data lines when the thin film transistors are in the ON-state is large.

Here, technology has been proposed in which an X-ray image is configured using image data that is read in a process that detects the incidence start time of the X-rays. According to such technology, it is unknown when the incidence start of the X-rays may occur; therefore, the reading of the current that flows in the data lines (the reading of the image data) is performed continuously and repeatedly. Therefore, the power consumption is large. Also, there is a risk that the noise may increase, and the imaging time may be limited due to a temperature increase.

Also, when the incidence of the X-rays starts or the incidence of the X-rays ends in the process of reading the image data of one X-ray image, image spots easily occur at the incidence start time of the X-rays and the incidence end time of the X-rays.

Therefore, it is desirable to develop a radiation detector in which the incidence start time of radiation can be detected with high accuracy, and the quality of the radiation image can be improved.

DETAILED DESCRIPTION

A radiation detector according to an embodiment includes: a substrate; multiple control lines that are provided in the substrate and extend in a first direction; multiple data lines that are provided in the substrate and extend in a second direction crossing the first direction; multiple detecting parts that detect radiation directly or in collaboration with a scintillator and include thin film transistors electrically connected to corresponding control lines and corresponding data lines; a control circuit switching between an ON-state and an OFF-state of the thin film transistor; a signal detection circuit reading image data when the thin film transistor is in the ON-state; and an incident radiation detecting part determining an incidence start time of the radiation based on a value of the image data read when the thin film transistor is in the ON-state. When the incident radiation detecting part determines that an incidence of the radiation has started, the signal detection circuit performs a first reading process of further reading image data when the thin film transistor is in the ON-state. The control circuit performs an image storage process of setting all of the thin film transistors to the OFF-state after the first reading process.

Embodiments will now be illustrated with reference to the drawings. Similar components in the drawings are marked with the same reference numerals; and a detailed description is omitted as appropriate.

A radiation detector according to the embodiment is applicable to various radiation other than X-rays such as γ-rays, etc. Here, as an example, the case relating to X-rays is described as a typical example of radiation. Accordingly, applications to other radiation also are possible by replacing "X-ray" of embodiments described below with "other radiation".

Also, an X-ray detector 1 illustrated below is an X-ray planar sensor that detects an X-ray image that is a radiation image. X-ray planar sensors can be largely divided into direct conversion and indirect conversion.

Direct conversion is a technique in which photoconductive charge (charge) that is generated in a photoconductive film interior by incident X-rays is directly guided by a high electric field to a storage capacitor for charge storage.

Indirect conversion is a technique in which X-rays are converted into fluorescence (visible light) by a scintillator; the fluorescence is converted into charge by a photoelectric conversion element such as a photodiode, etc.; and the charge is guided to a storage capacitor.

Although the indirect conversion X-ray detector 1 is illustrated as an example hereinbelow, the invention is applicable also to a direct conversion X-ray detector.

In other words, it is sufficient for the X-ray detector to include a detecting part that converts X-rays into electrical information. For example, the detecting part can detect the X-rays directly or in collaboration with a scintillator.

Known technology is applicable to the basic configuration of a direct conversion X-ray detector; and a detailed description is therefore omitted.

Also, for example, the X-ray detector 1 can be used in general medical care, etc. However, the applications of the X-ray detector 1 are not limited to general medical care, etc.

Figure 1:
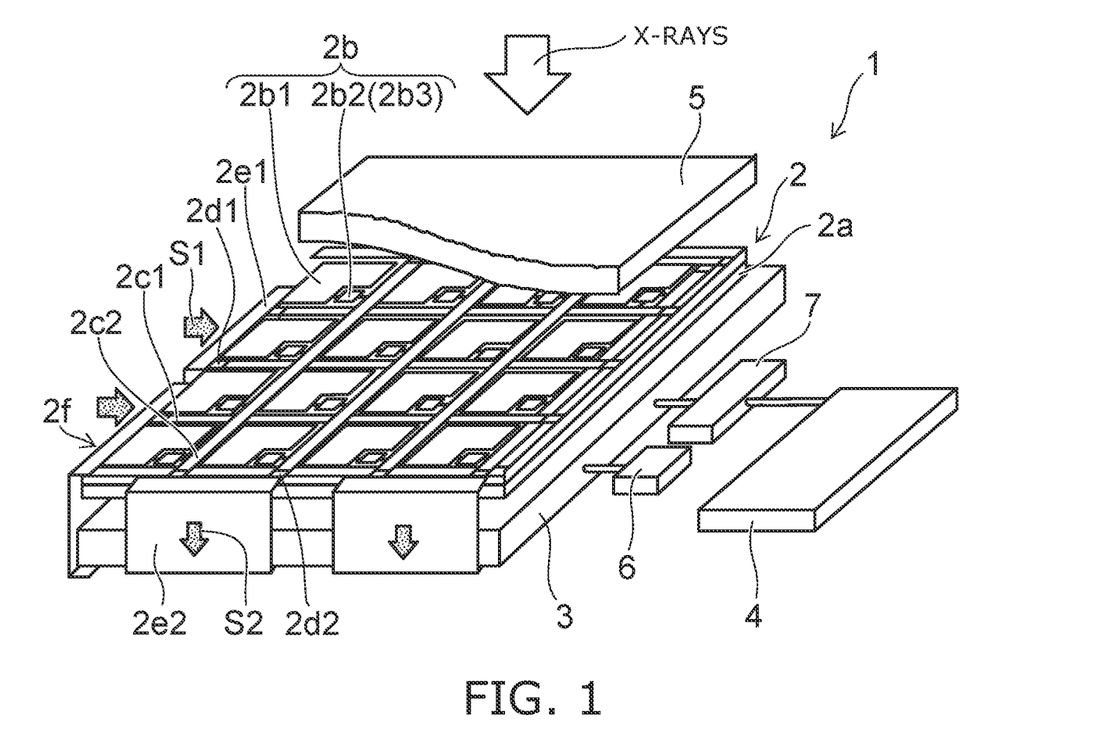
FIG. 1 is a schematic perspective view for illustrating an X-ray detector.

FIG. 1 is a schematic perspective view for illustrating the X-ray detector 1.

A bias line 2$c$3, etc., are not illustrated in FIG. 1.

Figure 2:
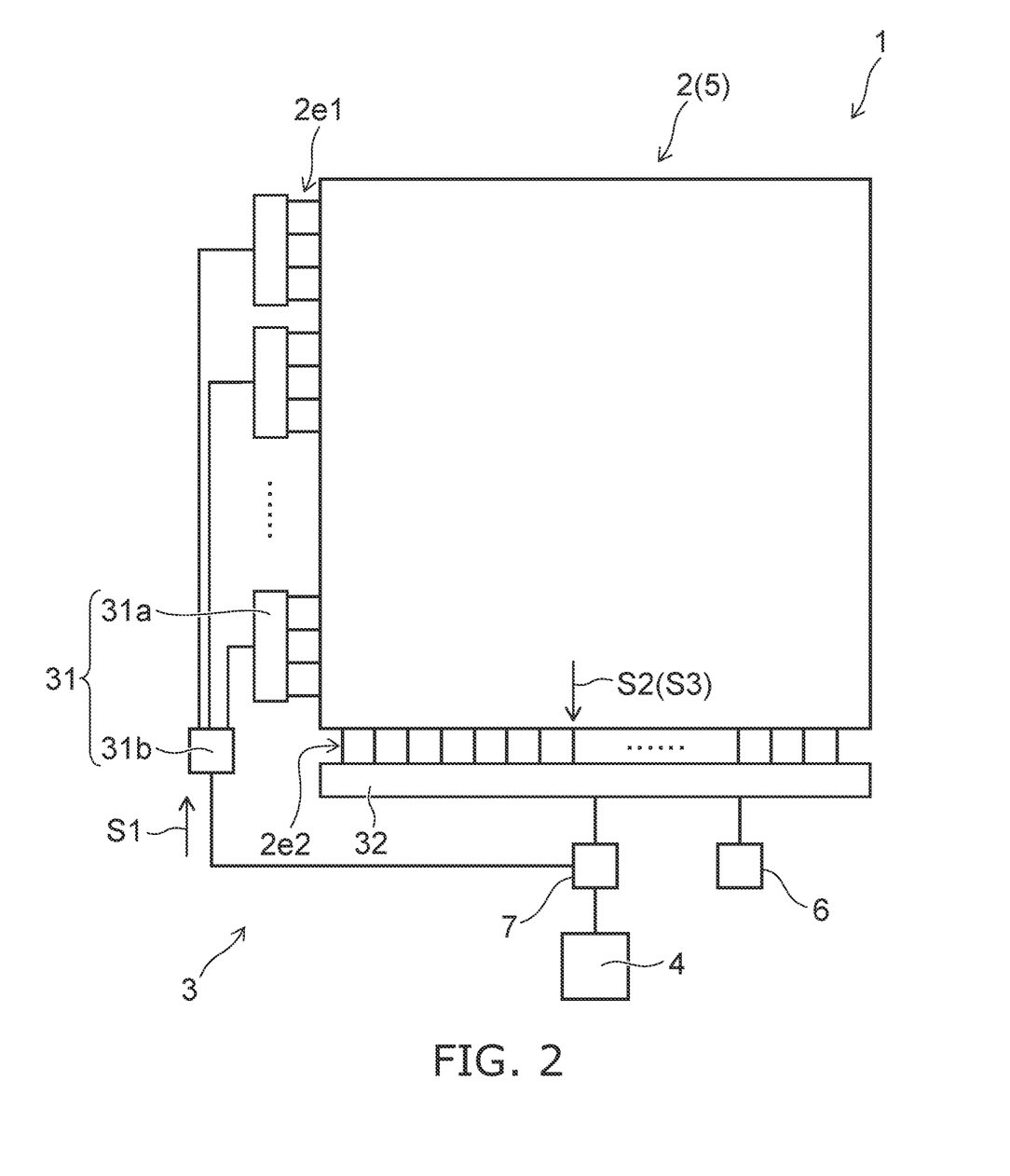
FIG. 2 is a block diagram of the X-ray detector.

FIG. 2 is a block diagram of the X-ray detector 1.

Figure 3:
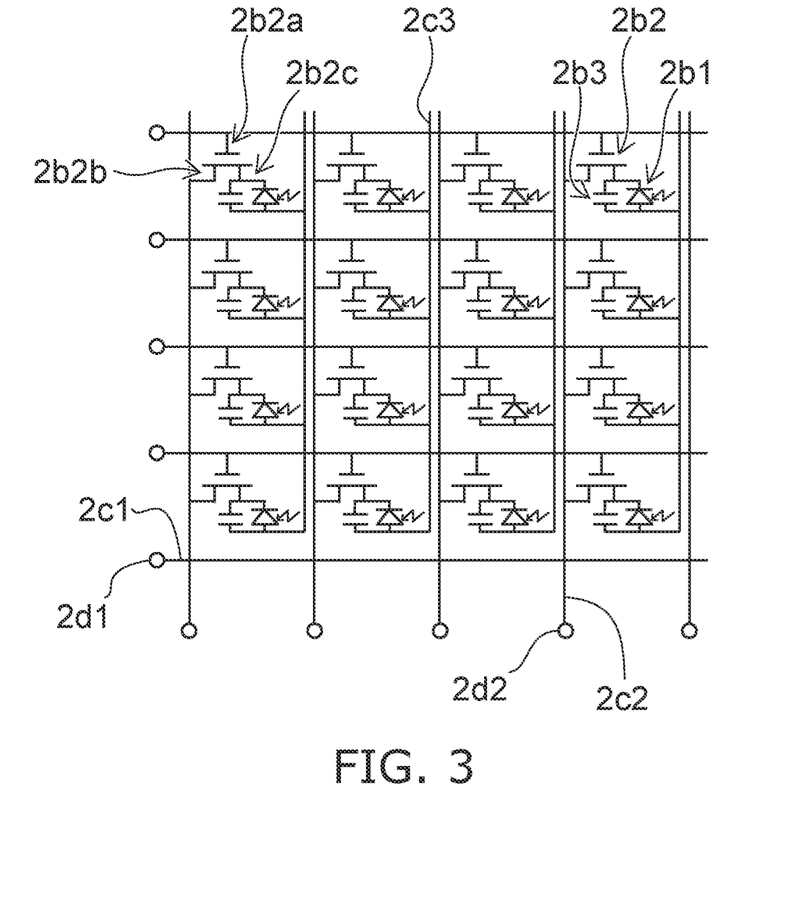
FIG. 3 is a circuit diagram of an array substrate.

FIG. 3 is a circuit diagram of an array substrate 2.

As shown in FIGS. 1 to 3, the array substrate 2, a signal processor 3, an image processor 4, a scintillator 5, an incident X-ray detecting part 6, and memory 7 can be provided in the X-ray detector 1.

The array substrate 2 can convert, into an electrical signal, the fluorescence that is converted from the X-rays by the scintillator 5.

The array substrate 2 can include a substrate 2$a$, a photoelectric converter 2$b$, a control line (or gate line) 2$c$1, a data line (or signal line) 2$c$2, the bias line 2$c$3, an interconnect pad 2$d$1, an interconnect pad 2$d$2, a protective layer 2$f$, etc.

According to the embodiment, the photoelectric converter 2$b$ is a detecting part that detects X-rays in collaboration with the scintillator 5.

The numbers of the photoelectric converters 2$b$, the control lines 2$c$1, the data lines 2$c$2, the bias lines 2$c$3, etc., are not limited to those illustrated.

The substrate 2$a$ can have a plate shape and can be formed from a light-transmitting material such as alkali-free glass, etc.

Multiple photoelectric converters 2$b$ can be provided at one surface of the substrate 2$a$. The photoelectric converters 2$b$ can be provided in regions defined by the control lines 2$c$1 and the data lines 2$c$2. The multiple photoelectric converters 2$b$ can be arranged in a matrix configuration. For example, one photoelectric converter 2$b$ corresponds to one pixel (pixel) of an X-ray image.

A photoelectric conversion element 2$b$1 and a thin film transistor (TFT; Thin Film Transistor) 2$b$2 can be provided in each of the multiple photoelectric converters 2$b$. As shown in FIG. 3, a storage capacitor 2$b$3 to which a charge that is converted by the photoelectric conversion element 2$b$1 is supplied also can be provided. For example, the storage capacitor 2$b$3 can have a plate shape and can be provided under the thin film transistor 2$b$2. However, according to the capacitance of the photoelectric conversion element 2$b$1, the photoelectric conversion element 2$b$1 also can be used as the storage capacitor 2$b$3.

When the photoelectric conversion element 2$b$1 also is used as the storage capacitor 2$b$3 (when the storage capacitor 2$b$3 is omitted), the photoelectric conversion element 2$b$1 stores and discharges the charge. In such a case, the charge is discharged from the photoelectric converter 2$b$ by setting the thin film transistor 2$b$2 to the ON-state; and the charge is stored in the photoelectric converter 2$b$ by setting the thin film transistor 2$b$2 to the OFF-state.

When the storage capacitor 2$b$3 is provided, and when the thin film transistor 2$b$2 is set to the OFF-state, a constant charge from the bias line 2$c$3 is stored in the storage capacitor 2$b$3; and when the thin film transistor 2$b$2 is set to the ON-state, the charge that is stored in the storage capacitor 2$b$3 is discharged.

A case where the storage capacitor 2$b$3 is provided will now be illustrated as an example.

The photoelectric conversion element 2$b$1 can be, for example, a photodiode, etc.

The thin film transistor 2$b$2 can switch between storing and discharging charge to and from the storage capacitor 2$b$3. The thin film transistor 2$b$2 can include a semiconductor material such as amorphous silicon (a-Si), polysilicon (P—Si), etc. The thin film transistor 2$b$2 can include a gate electrode 2$b$2$a$, a drain electrode 2$b$2$b$, and a source electrode 2$b$2$c$. The gate electrode 2$b$2$a$ of the thin film transistor 2$b$2 can be electrically connected with the corresponding control line 2$c$1. The drain electrode 2$b$2$b$ of the thin film transistor 2$b$2 can be electrically connected with the corresponding data line 2$c$2.

In other words, the thin film transistor 2$b$2 can be electrically connected to the corresponding control line 2$c$1 and the corresponding data line 2$c$2. The source electrode 2$b$2$c$ of the thin film transistor 2$b$2 can be electrically connected to the corresponding photoelectric conversion element 2$b$1 and storage capacitor 2$b$3. Also, the storage capacitor 2$b$3 and the anode side of the photoelectric conversion element 2$b$1 can be electrically connected with the corresponding bias line 2$c$3 (referring to FIG. 3).

Multiple control lines 2$c$1 can be provided to be parallel to each other with a prescribed spacing interposed. For example, the control line 2$c$1 extends in a row direction (corresponding to an example of a first direction). One control line 2$c$1 can be electrically connected with one of the multiple interconnect pads 2$d$1 provided at the peripheral edge vicinity of the substrate 2$a$. One of the multiple interconnects provided in a flexible printed circuit board 2$e$1 can be electrically connected to one interconnect pad 2$d$1. The other ends of the multiple interconnects provided in the flexible printed circuit board 2$e$1 each can be electrically connected with a control circuit 31 provided in the signal processor 3.

Multiple data lines 2$c$2 can be provided to be parallel to each other with a prescribed spacing interposed. For example, the data line 2$c$2 extends in a column direction (corresponding to an example of a second direction) orthogonal to the row direction. One data line 2$c$2 can be electrically connected with one of the multiple interconnect pads 2$d$2 provided at the peripheral edge vicinity of the substrate 2$a$. One of the multiple interconnects provided in a flexible printed circuit board 2$e$2 can be electrically connected to one interconnect pad 2$d$2. The other ends of the multiple interconnects provided in the flexible printed circuit board 2$e$2 each can be electrically connected with the signal detection circuit 32 provided in the signal processor 3.

As shown in FIG. 3, the bias line 2c3 can be provided to be parallel to the data line 2c2 between the data line 2c2 and the data line 2c2. A not-illustrated bias power supply can be electrically connected to the bias line 2c3. For example, a not-illustrated bias power supply can be provided in the signal processor 3, etc. The bias line 2c3 is not always necessary; it is sufficient to provide the bias line 2c3 as necessary. When the bias line 2c3 is not provided, the storage capacitor 2b3 and the anode side of the photoelectric conversion element 2b1 can be electrically connected to ground instead of the bias line 2c3.

For example, the control line 2c1, the data line 2c2, and the bias line 2c3 can be formed using a low-resistance metal such as aluminum, chrome, etc.

The protective layer 2f can cover the photoelectric converter 2b, the control line 2c1, the data line 2c2, and the bias line 2c3. The protective layer 2f includes, for example, at least one of an oxide insulating material, a nitride insulating material, an oxynitride insulating material, or a resin material.

The signal processor 3 can be provided at the side opposite to the scintillator 5 side of the array substrate 2.

The control circuit 31 and the signal detection circuit 32 can be provided in the signal processor 3. The control circuit 31 can switch between the ON-state and OFF-state of the thin film transistor 2b2.

As shown in FIG. 2, the control circuit 31 can include multiple gate drivers 31a and a row selection circuit 31b.

A control signal S1 can be input from the image processor 4, etc., to the row selection circuit 31b. The row selection circuit 31b can input the control signal S1 to the corresponding gate driver 31a according to the scan direction of the X-ray image.

The gate driver 31a can input the control signal S1 to the corresponding control line 2c1. For example, the control circuit 31 can sequentially input the control signal S1 to each control line 2c1 via the flexible printed circuit board 2e1. The thin film transistors 2b2 are set to the ON-state by the control signal S1 input to the control line 2c1; and the charge (an image data S2) can be read from the photoelectric converters 2b (the storage capacitors 2b3).

In the specification, the data that is read when the thin film transistors 2b2 are in the ON-state is taken as the "image data S2"; and the data that is read when the thin film transistors 2b2 are in the OFF-state is taken as "correction data S3".

The signal detection circuit 32 can read the charge (the image data S2) from the photoelectric converters 2b (the storage capacitors 2b3) when the thin film transistors 2b2 are in the ON-state. Also, the signal detection circuit 32 can sequentially convert the image data S2 (the analog signal) that is read into a digital signal.

Also, the signal detection circuit 32 can further read the correction data S3 when the thin film transistors 2b2 are in the OFF-state. The signal detection circuit 32 can sequentially convert the correction data S3 (the analog signal) that is read into a digital signal.

Also, the signal detection circuit 32 can read the correction data S3 before reading the image data S2, after reading the image data S2, or before reading the image data S2 and after reading the image data S2.

Also, the control circuit 31 can input the control signal S1 that switches between the ON-state and OFF-state of the thin film transistors 2b2 to each of the multiple control lines 2c1. Also, the signal detection circuit 32 can read the correction data S3 each time the control signal S1 is input.

Also, the signal detection circuit 32 can assign an image index for using the image data S2 and the correction data S3 that is read before reading the image data S2, after reading the image data S2 or before reading the image data S2 and after reading the image data S2 as a set.

Also, the signal detection circuit 32 can convert a differential output of the image data S2 that is read and the correction data S3 that is read into a digital signal and transmit the digital signal to the image processor 4. Thus, the real-time quality can be improved because the corrected image data can be input to the image processor 4.

Also, when the incident radiation detecting part 6 determines that the incidence of the X-rays has started, the signal detection circuit 32 can further read the image data S2 when the thin film transistors 2b2 are in the ON-state.

Details relating to the image data S2, the correction data S3, and the image index are described below.

Also, when X-rays are incident on the thin film transistor 2b2 that is a semiconductor element, a current flows between the drain electrode 2b2b and the source electrode 2b2c even when the thin film transistors 2b2 are in the OFF-state. In other words, while the X-rays are incident, a current inflows from the thin film transistor 2b2 in the OFF-state. Therefore, it is favorable for the sampling time of reading the image data S2 (the time of a first sampling signal 21) and the sampling time of reading the correction data S3 (the time of a second sampling signal 22) while the X-rays are incident to be short.

On the other hand, after the incidence of the X-rays has ended, the current does not inflow from the thin film transistor 2b2 in the OFF-state. Therefore, after the incidence of the X-rays has ended, image spots do not occur even when the sampling time of reading the image data S2 and the time that the thin film transistors 2b2 are set to the ON-state are set to be long. Also, the quality of the X-ray image can be improved if the sampling time of reading the image data S2 and the time that the thin film transistors 2b2 are set to the ON-state are set to be long.

In such a case, because the incidence period of the X-rays is short, the sampling time of reading the image data S2 and the time that the thin film transistors 2b2 are set to the ON-state after the incidence of the X-rays is detected can be set to be greater than the sampling time of reading the image data S2 and the sampling time of reading the correction data S3 before the incidence of the X-rays is detected. Thus, the occurrence of the image spots can be suppressed, and the quality of the X-ray image can be improved.

The memory 7 can be electrically connected between the signal detection circuit 32 and the image processor 4. The memory 7 can temporarily store the image data S2 and the correction data S3 that are converted into digital signals. In such a case, the image data S2 and the correction data S3 to which the image index is assigned can be stored.

The image processor 4 can configure an X-ray image based on the image data S2 stored in the memory 7. Also, the image processor 4 can correct the image data S2 by using the correction data S3. In such a case, the image processor 4 can extract the correction data S3 based on the image index and can correct the image data S2 by using the extracted correction data S3 that is in a set with the image data S2.

The image processor 4, the memory 7, and the incident X-ray detecting part 6 may be integrated with the signal processor 3.

The scintillator 5 is provided on the multiple photoelectric conversion elements 2b1 and can convert the incident X-rays into fluorescence. The scintillator 5 can be provided to cover a region (an effective pixel region) on the substrate 2a in which the multiple photoelectric converters 2b are provided. For example, the scintillator 5 can be formed using cesium iodide (CsI):thallium (TI), sodium iodide (NaI):thallium (TI), etc. In such a case, if the scintillator 5 is formed using vacuum vapor deposition, etc., a scintillator 5 that is made of an aggregate of multiple columnar crystals can be formed.

Also, for example, the scintillator 5 also can be formed using gadolinium oxysulfide ($Gd_2O_2S$), etc. In such a case, a trench portion having a matrix configuration can be formed so that a rectangular-prism-shaped scintillator 5 is provided for each of the multiple photoelectric converters 2b.

Also, to increase the utilization efficiency of the fluorescence and improve the sensitivity characteristics, a not-illustrated reflective layer can be provided to cover the front side of the scintillator 5 (the incident surface side of the X-rays).

Also, a not-illustrated moisture-resistant body that covers the scintillator 5 and the reflective layer can be provided to suppress the degradation of the characteristics of the scintillator 5 and the characteristics of the reflective layer due to water vapor that is included in air.

Generally, an X-ray detector can configure an X-ray image as follows.

First, the control circuit 31 sets the thin film transistors 2b2 to the OFF-state. By the thin film transistors 2b2 being set to the OFF-state, a constant charge is stored in the storage capacitors 2b3 via the bias lines 2c3. Then, when the X-rays are incident, the X-rays are converted into fluorescence by the scintillator 5. When the fluorescence is incident on the photoelectric conversion element 2b1, a charge (electrons and holes) is generated due to the photoelectric effect; the generated charge and the stored charge (the heterogeneous charge) combine; and the stored charge decreases. Then, the control circuit 31 sequentially sets the thin film transistors 2b2 to the ON-state. The signal detection circuit 32 reads the charge (the image data S2) that is stored in the storage capacitors 2b3 via the data lines 2c2 according to the sampling signal. Then, the signal detection circuit 32 sequentially converts the image data S2 (the analog signal) that is read into a digital signal. Also, the signal detection circuit 32 converts the value of the current that flows in the data lines 2c2 when the thin film transistors 2b2 are in the OFF-state into a digital signal.

The memory 7 temporarily stores the data that is obtained when the thin film transistors 2b2 are in the ON-state as the image data S2. Also, the memory 7 stores the data that is obtained when the thin film transistors 2b2 are in the OFF-state as the correction data S3.

The image processor 4 configures an X-ray image based on the image data S2 stored in the memory 7. Also, when configuring the X-ray image, the image processor 4 performs a correction for suppressing the image spots described below by using the correction data S3 stored in the memory 7. The data of the X-ray image on which the correction for suppressing the image spots is performed is output from the image processor 4 toward an external device, etc.

Here, in a general X-ray detector, the imaging operation is started as follows. First, it is recognized that X-rays are incident on the X-ray detector by a signal from an external device such as an X-ray source, etc. Then, after a predetermined amount of time has elapsed, the thin film transistors 2b2 of the photoelectric converters 2b performing the reading are set to the ON-state, and the stored charge is read. In other words, in a general X-ray detector, the X-rays that are actually incident on the X-ray detector are not detected. Therefore, in this technique, a synchronous interface for synchronizing the X-ray detector with the external device such as the X-ray source, etc., is necessary.

Here, when the X-rays are incident on the thin film transistor 2b2 that is a semiconductor element, a current flows between the drain electrode 2b2b and the source electrode 2b2c even when the thin film transistor 2b2 is in the OFF-state. Also, the drain electrode 2b2b of the thin film transistor 2b2 is electrically connected with the data line 2c2. Therefore, the incidence start time of the X-rays can be detected based on the difference between the value of the current that flows in the data lines 2c2 when the X-rays are incident on the thin film transistors 2b2 in the OFF-state and the value of the current that flows in the data lines 2c2 when the X-rays are not incident on the thin film transistors 2b2 in the OFF-state. As long as the incidence start time of the X-rays can be directly detected, a time lag or the like does not occur; therefore, a longer processing time can be suppressed.

However, the value of the current that flows in the data lines 2c2 when the thin film transistors 2b2 are in the OFF-state is extremely small. Also, because there are unfavorable effects on health when performing a large amount of X-ray irradiation on a human body, the X-ray irradiation amount on the human body is kept as low as possible. Therefore, when the X-ray detector is used in medical care, the intensity of the incident X-rays is extremely weak, and the value of the current that flows in the data lines 2c2 when the thin film transistors 2b2 are in the OFF-state is even smaller.

As a result, when the incidence start time of the X-rays is detected based on the value of the current that flows in the data lines 2c2 when the thin film transistors 2b2 are in the OFF-state, there is a risk that it may be difficult to detect the incidence start time of the X-rays with high accuracy.

Therefore, an incident X-ray detecting part 6 such as that described below is provided in the X-ray detector 1 according to the embodiment.

The incident X-ray detecting part 6 can be electrically connected with the signal detection circuit 32. When the thin film transistors 2b2 are in the ON-state, the incident X-ray detecting part 6 can determine the incidence start time of the X-rays based on the value of the current that flows in the data lines 2c2 to which the thin film transistors 2b2 are electrically connected. In other words, the incident X-ray detecting part 6 can determine the incidence start time of the X-rays based on the value of the image data S2 that is read when the thin film transistors are in the ON-state. For example, the incident X-ray detecting part 6 detects the current that flows in the data lines 2c2 to which the thin film transistors 2b2 that are in the ON-state is connected and can determine that X-rays are incident when the value of the detected current exceeds a prescribed threshold. The prescribed threshold can be preset based on the difference between the value of the current that flows in the data lines 2c2 when the X-rays are incident on the thin film transistor 2b2 that is in the ON-state and the value of the current that flows in the data lines 2c2 when the X-rays are not incident on the thin film transistor 2b2 that is in the ON-state.

If the thin film transistors 2b2 are in the ON-state, the electrical resistance can be reduced compared to when in the OFF-state; therefore, the value of the current that flows in the data lines 2c2 becomes large. Therefore, it is easy to detect the incidence start time of the X-rays. As described above, when the X-ray detector 1 is used in medical care, the intensity of the incident X-rays is extremely weak. If, however, the incidence start time of the X-rays is detected when the thin film transistors 2b2 are in the ON-state, the incidence start time of the X-rays can be detected with high accuracy.

However, a new problem occurs in which image spots occur because currents also flow in the data line 2c2 to which the thin film transistor 2b2 that is in the ON-state is connected from other thin film transistors 2b2 that are in the OFF-state.

In such a case, after the incidence of the X-rays has ended, currents from the other thin film transistors 2b2 do not flow in the data lines 2c2 to which the thin film transistors 2b2 that are set to the ON-state are connected. Therefore, the image spots can be suppressed if the data when the incidence of the X-rays has started is deleted, and the X-ray image is configured using only the data after the incidence of the X-rays has ended. However, doing so causes the quality of the X-ray image to degrade commensurately because the data that is generated when the incidence of the X-rays has started is lost.

Therefore, the incident X-ray detecting part 6 detects the current that flows in the data lines 2c2 in at least one of the OFF-state before setting the thin film transistors 2b2 to the ON-state or the OFF-state after setting the thin film transistors 2b2 to the ON-state. As described above, it is considered that the current from the thin film transistors 2b2 that are in the OFF-state is the major cause of the occurrence of the image spots. Therefore, the image spots can be drastically suppressed if the current that flows in the data lines 2c2 to which the thin film transistors 2b2 that will be in the ON-state are connected is detected in the OFF-state of at least one before or after the ON-state, and if the image data S2 that is acquired in the ON-state is corrected using the correction data S3 that is acquired in the OFF-state. Also, thus, the image data S2 when the incidence of the X-rays has started can be used; therefore, the degradation of the quality of the X-ray image can be suppressed.

In other words, if the incident X-ray detecting part 6 is provided, the incidence start time of the X-rays can be detected, and the degradation of the quality of the X-ray image can be suppressed.

Figure 4:
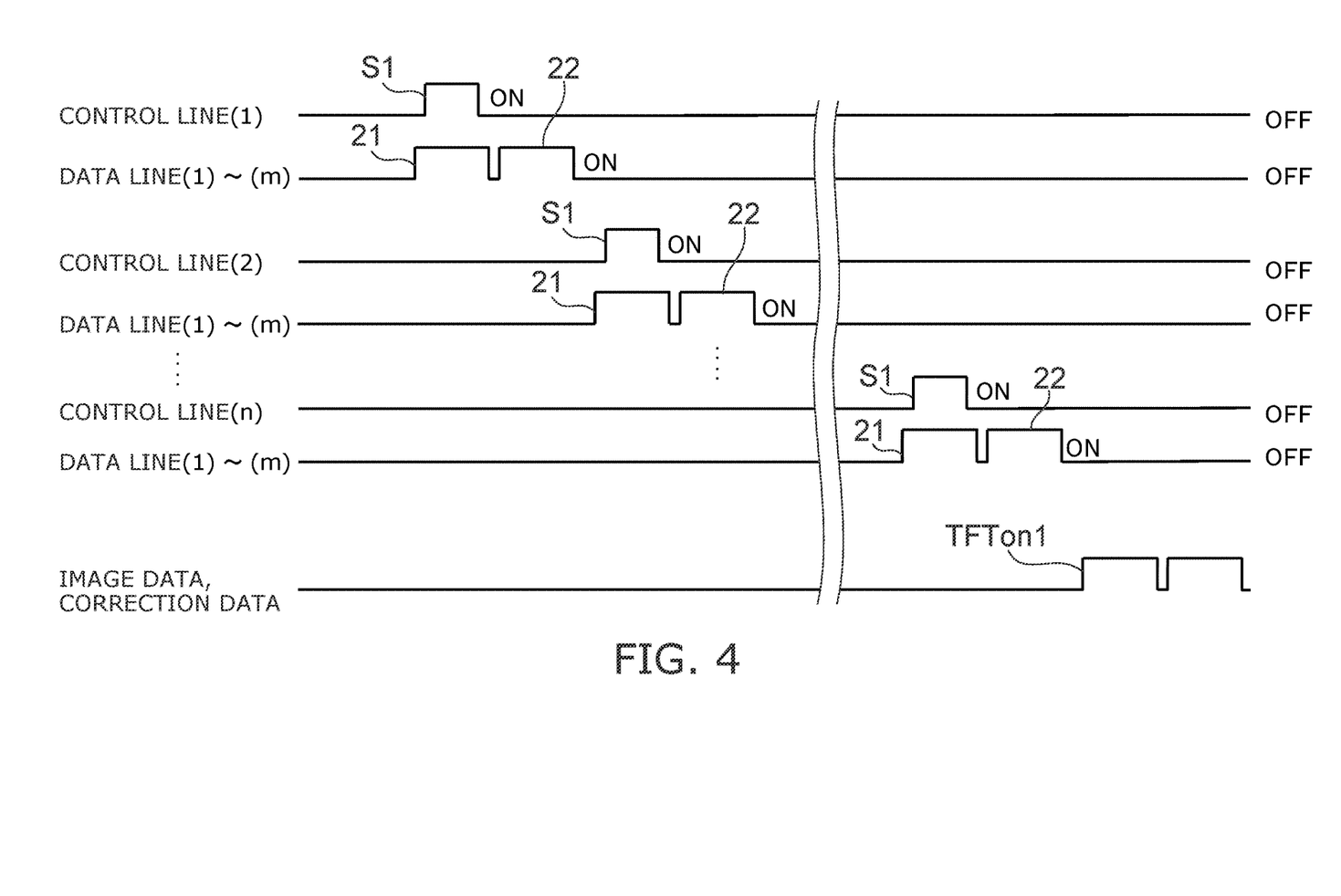
FIG. 4 is a timing chart for illustrating the reading of image data and correction data.

FIG. 4 is a timing chart for illustrating the reading of the image data S2 and the correction data S3.

FIG. 4 is a case where n control lines 2c1 and m data lines 2c2 are provided.

First, the first sampling signal 21 is input to the signal detection circuit 32 from the image processor 4, etc. As shown in FIG. 4, by switching the first sampling signal 21 ON, the signal detection circuit 32 starts the sampling of the data lines (1) to (m). The first sampling signal 21 is switched OFF after a prescribed period has elapsed.

On the other hand, while the first sampling signal 21 is switched ON, the control signal Si is input to the control line (1) from the image processor 4, etc., via the control circuit 31. By switching the control signal Si ON, the thin film transistors 2b2 that are electrically connected to the control line (1) are set to the ON-state. The control signal S1 is switched OFF after a prescribed period has elapsed.

The signal detection circuit 32 sequentially reads the image data S2 from the data lines (1) to (m) when the thin film transistors 2b2 are in the ON-state.

Also, the incident X-ray detecting part 6 determines the incidence start time of the X-rays based on the value of the current that flows in the data lines 2c2 when the first sampling signal 21 is ON.

Then, after the first sampling signal 21 is switched OFF, the second sampling signal 22 is input from the image processor 4, etc., to the signal detection circuit 32. By switching the second sampling signal 22 ON, the signal detection circuit 32 starts the sampling of the data lines (1) to (m). The second sampling signal 22 is switched OFF after a prescribed period has elapsed.

In such a case, the control signal S1 is not input to the control line (1); and the thin film transistors 2b2 that are electrically connected to the control line (1) remain in the OFF-state.

The signal detection circuit 32 detects the current that flows in each of the data lines (1) to (m) when the thin film transistors 2b2 are in the OFF-state.

Subsequently, the procedure described above is performed for the control lines (2) to (n).

Thus, the obtained data is stored in the memory 7. The data that is obtained when the thin film transistors 2b2 are in the ON-state becomes n rows and m columns of image data S2. The data that is obtained when the thin film transistors 2b2 are in the OFF-state becomes n rows and m columns of correction data S3.

Although a case is illustrated in which the image data S2 and the correction data S3 are stored in the same memory 7, the image data S2 and the correction data S3 may be stored in separate memory.

Also, image index can be assigned when storing the data that becomes the image data S2 and the data that becomes the correction data S3 in the memory 7. In the case illustrated in FIG. 4, an image index TFTon1 is assigned to the image data S2; and an image index TFToff1 is assigned to the correction data S3 that is in a set with the image data S2. In such a case, the image index TFTon1 indicates the image data S2 that is initially acquired; and TFToff1 indicates the correction data S3 that is in the set with the image data S2. The image index can be assigned to each of the data relating to the control lines (1) to (n).

Although the second sampling signal 22 is switched ON after the first sampling signal 21 is switched OFF in FIG. 4, the first sampling signal 21 may be switched ON after the second sampling signal 22 is switched OFF. In other words, although the correction data S3 is acquired after acquiring the image data S2 in FIG. 4, the image data S2 can be acquired after acquiring the correction data S3.

Also, the second sampling signal 22, the first sampling signal 21, and the second sampling signal 22 can be sequentially input to the signal detection circuit 32 when the control signal S1 is input to one control line. In such a case, only the first sampling signal 21 can be input to the signal detection circuit 32 when the control signal S1 is input to the next control line; and the second sampling signal 22, the first sampling signal 21, and the second sampling signal 22 can be sequentially input to the signal detection circuit 32 when the control signal S1 is input to the next control line.

In other words, it is sufficient for the first sampling signal 21 and the second sampling signal 22 to be alternately input.

Also, although the first sampling signal 21 is switched ON before the control signal S1 is switched ON in FIG. 4, the control signal S1 and the first sampling signal 21 may be simultaneously ON, or the first sampling signal 21 may be switched ON after the control signal S1 is switched ON.

Also, although the first sampling signal 21 is switched OFF after the control signal S1 is switched OFF in FIG. 4, a control signal S1 and the first sampling signal 21 may be simultaneously OFF, or the first sampling signal 21 may be switched OFF before the control signal S1 is switched OFF.

The alternating input of the first sampling signal 21 and the second sampling signal 22 (the alternating reading of the image data S2 and the correction data S3) will now be described further.

Figure 5:
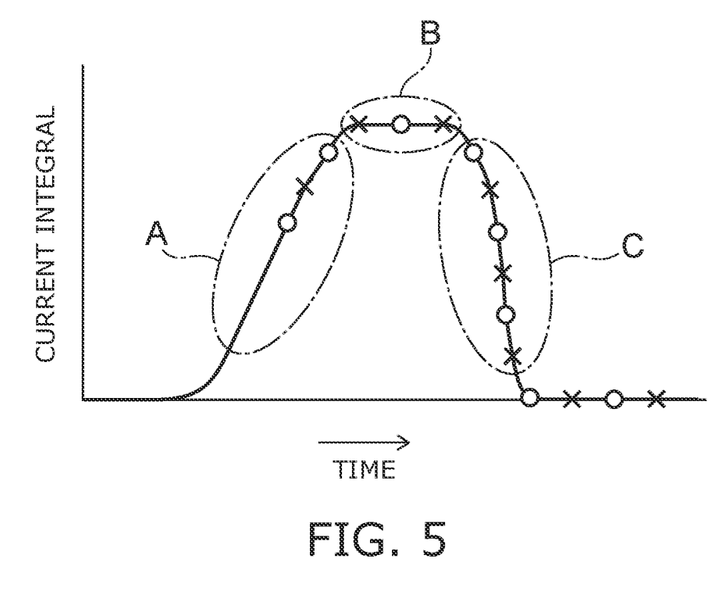
FIG. 5 is a schematic view for illustrating current flowing in a data line when X-rays are incident.

FIG. 5 is a schematic view for illustrating the current that flows in the data line 2c2 when the X-rays are incident.

In FIG. 5, "o" illustrates the timing of switching the first sampling signal 21 ON; and "x" illustrates the timing of switching the second sampling signal 22 ON.

When the X-rays are incident on the X-ray detector 1, a current that has a waveform such as that illustrated in FIG. 5 flows in the data line 2c2. In such a case, the change of the current value per unit time is large in region A and region C. On the other hand, the change of the current value per unit time is small in region B.

Here, it is favorable for the correction data S3 described above to be acquired at the same conditions as the image data S2 as much as possible. Therefore, it is favorable for the first sampling signal 21 and the second sampling signal 22 to be input in region B. However, the incidence start time of the X-rays is unknown; therefore, it is difficult to input the first sampling signal 21 and the second sampling signal 22 in region B.

Therefore, in the X-ray detector 1 according to the embodiment, the first sampling signal 21 and the second sampling signal 22 are alternately input.

For example, in the case illustrated in FIG. 5, the first sampling signal 21 that relates to the control line (1) can be input, and continuing, the second sampling signal 22 can be input as shown in FIG. 4.

Then, for example, the first sampling signal 21 that relates to the control line (2) can be input, and continuing, the second sampling signal 22 can be input.

Thereafter, the first sampling signal 21 and the second sampling signal 22 can be similarly input alternately.

Thus, the correction data S3 before and after one image data S2 can be obtained. As long as the correction data S3 before and after can be acquired, for example, an average value can be determined. Therefore, even when the change of the current value per unit time is large, the acquisition conditions of the correction data S3 can approach the acquisition conditions of the image data S2. As a result, the suppression of the image spots described below is easy because the correction accuracy can be increased.

Figure 6:
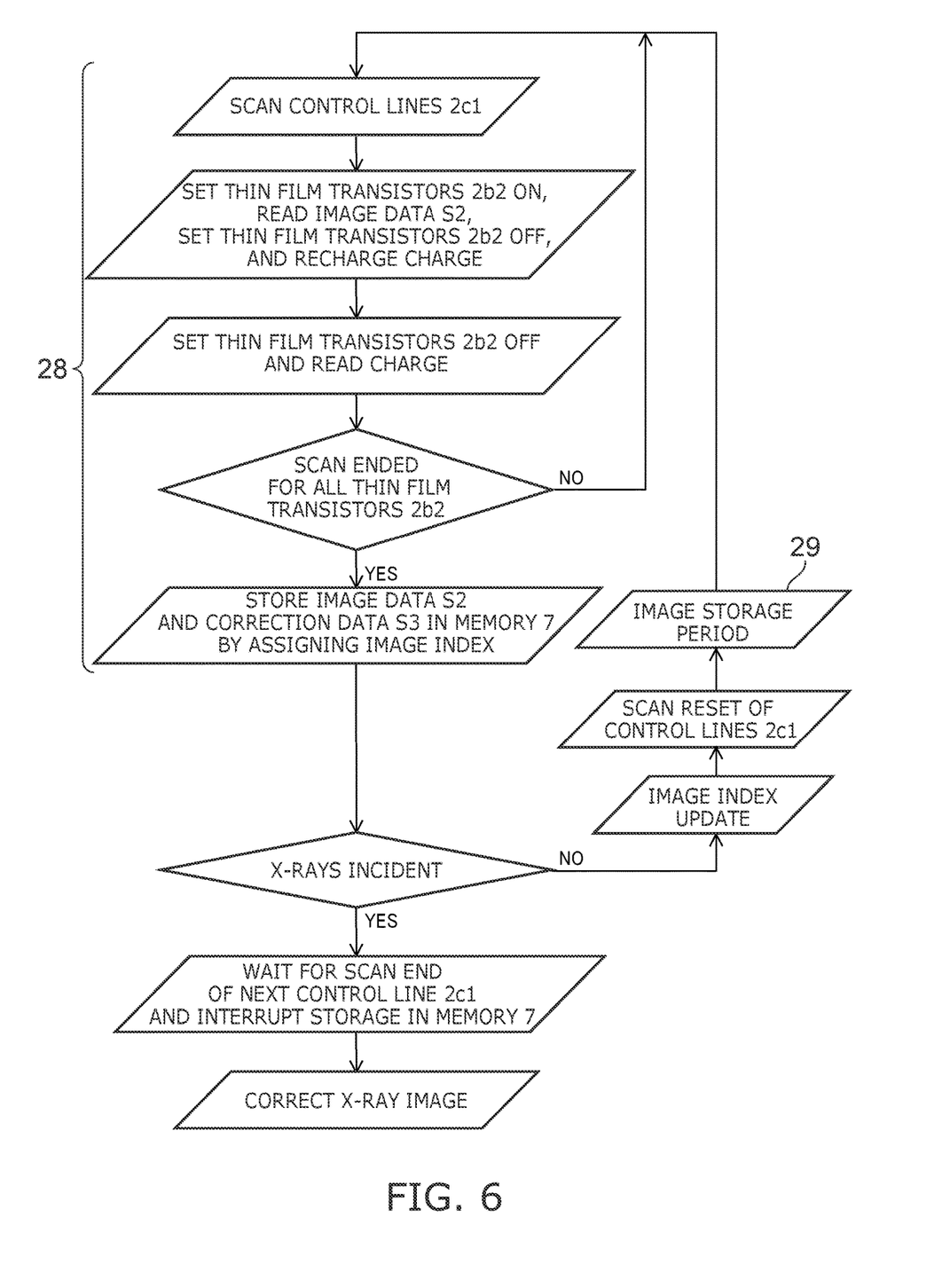
FIG. 6 is a flowchart for illustrating processing processes of the X-ray detector.

FIG. 6 is a flowchart for illustrating processing processes of the X-ray detector 1.

In a reading process 28 as shown in FIG. 6, for example, one control line 2c1 can be scanned, the thin film transistors 2b2 can be set to the ON-state, and the image data S2 can be read. The thin film transistors 2b2 can be set to the OFF-state; and the correction data S3 can be read. The image data S2 and the correction data S3 can be stored in the memory 7 by assigning the image index for each of the control lines 2c1.

Then, when the scanning (the reading) of all of the thin film transistors 2b2 electrically connected to the one control line 2c1 has ended, the incidence start of the X-rays can be determined using a predetermined threshold and the image data S2 that is stored in the memory 7. For example, the number of the image data S2 that exceeds the predetermined threshold can be counted, and it can be determined that X-rays are incident when a predetermined count is reached.

When it is determined that the X-rays are not incident, the image index can be updated, and the scanning of the control lines 2c1 can be reset. Then, the flow can return to the reading process 28 via an image storage process 29.

Details relating to the image storage process 29 are described below.

When it is determined that the X-rays are incident, the signal detection circuit 32 can further read the image data S2 when the thin film transistors 2b2 are in the ON-state.

In such a case, the end of the scanning of the control line 2c1 of the next period can be waited for, and the storage of the image data S2 and the correction data S3 in the memory 7 can be interrupted in the stage of storing in the memory 7. By interrupting the storing in the memory 7, the image data S2 and the correction data S3 that are already stored are not overwritten.

Then, the image data S2 and the correction data S3 after the incidence of the X-rays can be extracted based on the image index assigned to the period in which it is determine that X-rays are incident; and the X-ray image can be configured by the image processor 4. In such a case, the image spots can be suppressed by correcting the image data S2 by using the correction data S3.

Here, the suppression of the image spots will now be described further.

As described above, image spots occur when the thin film transistors 2b2 are set to the ON-state, the control lines 2c1 are sequentially scanned, and the incidence of the X-rays is determined from the obtained image data S2. The major cause of the occurrence of the image spots can be considered to be as follows. Multiple thin film transistors 2b2 are electrically connected to one data line 2c2. The control lines 2c1 are scanned; and when the thin film transistors 2b2 that are electrically connected to the desired control line 2c1 are set to the ON-state, the thin film transistors 2b2 that are electrically connected to the other control lines 2c1 are in the OFF-state. If the thin film transistor 2b2 is in the OFF-state, a current does not flow between the source electrode 2b2c and the drain electrode 2b2b. However, when X-rays or the fluorescence that is converted by the scintillator 5 is incident on the thin film transistor 2b2, the resistance value between the source electrode 2b2c and the drain electrode 2b2b drops. When the resistance value drops, a portion of the charge that is stored in the storage capacitor 2b3 is discharged to the data line 2c2 and becomes a current that flows in the data line 2c2. It is considered that the image spots occur due to this current.

Here, the resistance value between the source electrode 2b2c and the drain electrode 2b2b changes according to the intensity of the X-rays incident on the X-ray detector 1. For example, the intensity of the X-rays that are incident on the X-ray detector 1 greatly changes at the incidence start time and end time of the X-rays. Therefore, the resistance value between the source electrode 2b2c and the drain electrode 2b2b also greatly changes at the incidence start time and end time of the X-rays. In such a case, as illustrated in FIG. 5, the current that flows in the data line 2c2 also greatly changes.

To effectively suppress the image spots, it is necessary to know the resistance value change of the thin film transistors 2b2 in the OFF-state that are electrically connected to the other control lines 2c1 when setting the thin film transistors 2b2 that are electrically connected to the desired control line 2c1 to the ON-state.

As described above, the resistance value change can be known by setting all of the thin film transistors 2b2 to the OFF-state and switching the second sampling signal 22 ON at timing before and after setting the thin film transistors 2b2 to the ON-state (switching the first sampling signal 21 ON) and by detecting the current in all of the data lines 2c2.

The number of the data lines 2c2 of the general X-ray detector is not less than 500 lines; but many of the thin film transistors 2b2 are in the OFF-state; therefore, the image spots can be effectively suppressed if the correction data S3 that is generated from the current of all of the data lines 2c2 is used.

Also, when the ON times of the first sampling signal 21 and the second sampling signal 22 are changed, the value of the current integral illustrated in FIG. 5 fluctuates. On the other hand, the value of the current integral illustrated in FIG. 5 has no relationship with the time that the thin film transistors 2b2 are set to the ON-state (the ON time of the control signal S1).

The integration of the current that flows in the data lines 2c2 is started by switching the first sampling signal 21 ON; and the integration is ended by switching the first sampling signal 21 OFF. Then, the current value that flows while the first sampling signal 21 is ON is summed and output as a digital signal (a current integral).

There is a risk that the quality of the X-ray image may degrade if the time that the thin film transistors 2b2 are set to the ON-state is not somewhat long. However, it is unnecessary to increase the time that the thin film transistors 2b2 are set to the ON-state in the period that the X-rays are incident; and it is favorable to reduce the current integral by reducing the time that the thin film transistors 2b2 are set to the ON-state to reduce the effects of the leakage current. On the other hand, it is favorable to increase the time that the thin film transistors 2b2 are set to the ON-state after the incidence of the X-rays has ended because there is no leakage current.

In such a case, because the incidence period of the X-rays is short, the sampling time of reading the image data S2 and the time that the thin film transistors 2b2 are set to the ON-state after the incidence of the X-rays is detected can be set to be greater than the sampling time of reading the image data S2 and the sampling time of reading the correction data S3 before the incidence of the X-rays is detected.

Thus, the occurrence of the image spots can be suppressed, and the quality of the X-ray image can be improved.

The image storage process 29 will now be described further.

Figure 7:
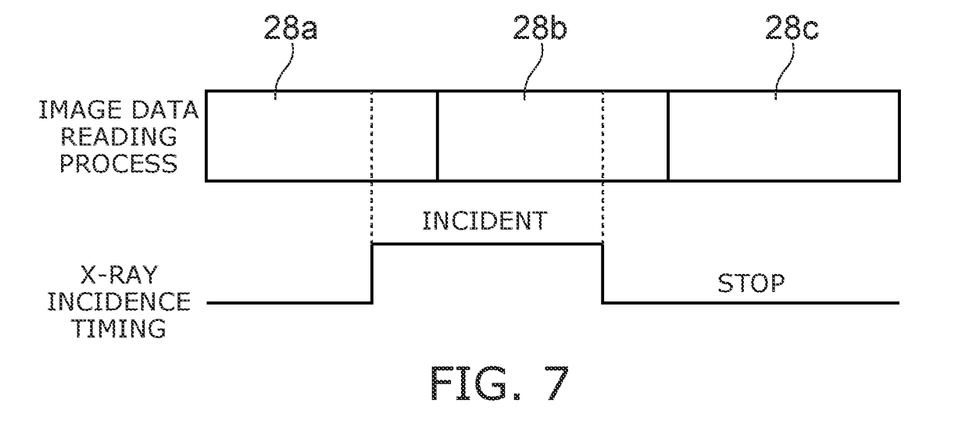
FIG. 7 is a timing chart for illustrating imaging of an X-ray image according to a comparative example.

FIG. 7 is a timing chart for illustrating images of an X-ray image according to a comparative example.

FIG. 7 is a case where three X-ray images are continuously imaged.

When the X-ray images are continuously imaged, there are cases where the incidence of the X-rays starts partway through a reading process 28a (corresponding to an example of a first reading process) of reading the image data S2 of one X-ray image as shown in FIG. 7. Also, there are cases where the incidence of the X-rays ends partway through a reading process 28b (corresponding to an example of a second reading process) of reading the image data S2 of one X-ray image. As described above, the resistance value between the source electrode 2b2c and the drain electrode 2b2b greatly changes at the incidence start time and end time of the X-rays. Therefore, as illustrated in FIG. 5, the current that flows in the data lines 2c2 greatly changes; and the suppression of the image spots becomes difficult.

In such a case, the incidence start of the X-rays and the incidence end of the X-rays are not performed in a reading process 28c of reading the image data S2 of one X-ray image. Therefore, the suppression of the image spots can be realized by adding the image data S2 that is read in the reading process 28a to 28c.

However, by doing so, the number of the image data S2 that is necessary when configuring the X-ray image is high. Also, when the number of the image data S2 that are added is high, new problems occur in which the quality of the X-ray image degrades because the noise is added, etc.

Figure 8:
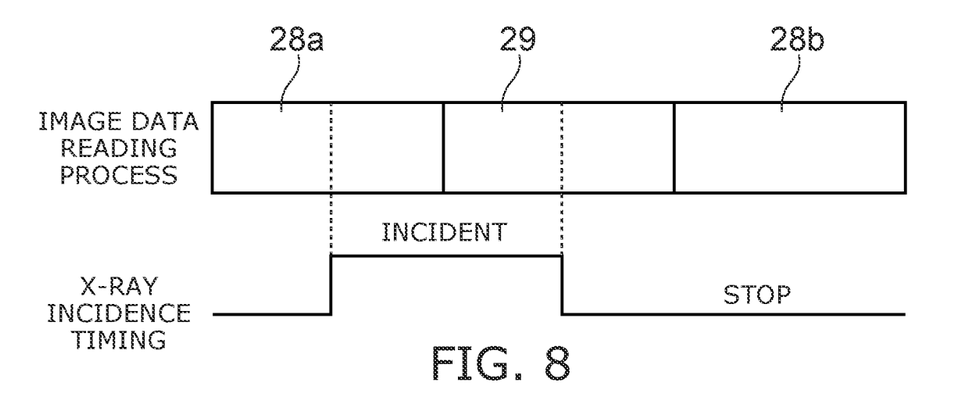
FIG. 8 is a timing chart for illustrating imaging of an X-ray image according to the embodiment.

FIG. 8 is a timing chart for illustrating imaging of the X-ray image according to the embodiment.

As shown in FIG. 8, the image storage process 29 can be provided between the reading process 28a and the reading process 28b. In the image storage process 29, all of the thin film transistors 2b2 can be set to the OFF-state; and charge that corresponds to the intensity distribution of the fluorescence generated by the scintillator 5 can be stored in all of the photoelectric converters 2b (the storage capacitors 2b3). The charge that is stored in the image storage process 29 can be read as the image data S2 in the reading process 28b that is performed after the image storage process 29.

In other words, when the incident radiation detecting part 6 determines that the incidence of the X-rays has started, the signal detection circuit 32 can perform the reading process 28a of further reading the image data S2 when the thin film transistors 2b2 are in the ON-state. The control circuit 31 can perform the image storage process 29 of setting all of the thin film transistors 2b2 to the OFF-state after the reading process 28a.

The signal detection circuit 32 can perform the reading process 28b of reading the image data S2 when the thin film transistors 2b2 are in the ON-state after the image storage process 29.

The period of the image storage process 29 can be greater than the incidence period of the X-rays. Thus, the incidence of the X-rays can end in the period of the image storage process 29. Also, the period of the image storage process 29 can be modifiable according to the incidence period of the X-rays.

Even if the X-rays are incident in the image storage process 29, the control lines 2c1 are not scanned; therefore, image spots do not occur due to the change of the resistance value described above. Therefore, the suppression of the image spots can be realized by reading the charge that is stored in the image storage process 29 as the image data S2 in the reading process 28b and by adding the image data S2 that is read in the reading process 28a and 28b.

In other words, the image processor 4 can add the image data S2 that is read in the reading process 28a and the image data S2 that is read in the reading process 28b.

In such a case, the correction data S3 can no longer be acquired in the reading process 28b. Therefore, it can be determined whether or not it is necessary to correct the image data S2 based on the correction data S3 of the reading process 28a.

In other words, the signal detection circuit 32 can read the correction data S3 when the thin film transistors 2b2 are in the OFF-state in the reading process 28a.

The signal detection circuit 32 can read the correction data S3 before reading the image data S2, after reading the image data S2, or before reading the image data S2 and after reading the image data S2 in the reading process 28a.

The image processor 4 can correct the image data S2 that is read in the reading process 28a by using the correction data S3.

By providing the image storage process 29, it is sufficient to add the image data S2 that is read in the reading process 28a and 28b; therefore, the number of the added image data can be reduced, and even the image degradation due to the superimposition of noise can be suppressed. Also, the image data S2 from the state directly after the incidence end of the X-rays in which the afterimage is large is not used; therefore, image artifacts due to the afterimage also can be reduced.

Therefore, according to the X-ray detector 1 according to the embodiment, the incidence start time of the X-rays can be detected with high accuracy, and the quality of the X-ray image can be improved.

Also, if the image storage process 29 is provided, the occurrence of false determinations can be suppressed because the time for determining the incidence of the X-rays can be sufficiently ensured.

Also, in the image storage process 29, the scanning of the control lines 2c1 and the reading of the image data S2 and the correction data S3 are not performed; therefore, the electrical power that is necessary to configure one X-ray image can be reduced. Therefore, the average power consumption can be reduced even if the reading process 28a, the image storage process 29, and the reading process 28b are repeated. Also, a noise increase or the occurrence of a limit of the imaging time due to a temperature increase can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

What is claimed is:

1. A radiation detector, comprising:
   a substrate;
   a plurality of control lines provided at the substrate, the plurality of control lines extending in a first direction;
   a plurality of data lines provided at the substrate, the plurality of data lines extending in a second direction crossing the first direction;
   a detecting part detecting radiation directly or in collaboration with a scintillator, the detecting part including a thin film transistor that is electrically connected to a corresponding control line of the control lines and a corresponding data line of the data lines, a plurality of the detecting parts being provided;
   a control circuit switching between an ON-state and an OFF-state of the thin film transistor;
   a signal detection circuit reading image data when the thin film transistor is in the ON-state; and
   an incident radiation detecting part determining an incidence start time of the radiation based on a value of the image data read when the thin film transistor is in the ON-state,
   when the incident radiation detecting part determines that an incidence of the radiation has started, the signal detection circuit performs a first reading process of further reading image data when the thin film transistor is in the ON-state, and the control circuit performs an image storage process of setting all of the thin film transistors to the OFF-state after the first reading process.

2. The radiation detector according to claim 1, wherein a period of the image storage process is greater than an incidence period of the radiation.

3. The radiation detector according to claim 1, wherein the incidence of the radiation ends in a period of the image storage process.

4. The radiation detector according to claim 1, wherein the signal detection circuit performs a second reading process of reading image data when the thin film transistor is in the ON-state after the image storage process.

5. The radiation detector according to claim 4, further comprising:
   an image processor configuring a radiation image based on the image data,
   the image processor adding the image data read in the first reading process and the image data read in the second reading process.

6. The radiation detector according to claim 5, wherein the signal detection circuit further reads correction data in the first reading process when the thin film transistor is in the OFF-state.

7. The radiation detector according to claim 6, wherein the signal detection circuit reads the correction data in the first reading process before the image data is read, after the image data is read, or before the image data is read and after the image data is read.

8. The radiation detector according to claim 6, wherein the image processor uses the correction data to correct the image data read in the first reading process.

* * * * *